(12) United States Patent  
Febbrarino et al.

(10) Patent No.: US 8,681,560 B2
(45) Date of Patent: Mar. 25, 2014

(54) CIRCUIT FOR THE OPTIMIZATION OF THE PROGRAMMING OF A FLASH MEMORY

(75) Inventors: Michele Febbrarino, Bagheria (IT); Maurizio Francesco Perroni, Furnari (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 172 days.

(21) Appl. No.: 13/170,591

(22) Filed: Jun. 28, 2011

(65) Prior Publication Data
US 2012/0002479 A1   Jan. 5, 2012

(30) Foreign Application Priority Data
Jun. 30, 2010  (IT) .................................. MI10A1197

(51) Int. Cl.
*G11C 11/34*  (2006.01)
*G11C 16/04*  (2006.01)

(52) U.S. Cl.
USPC ............... 365/185.18; 365/163; 365/189.011; 711/103; 711/157

(58) Field of Classification Search
USPC ................ 365/185.18, 163, 185.11, 189.011; 711/103, 157
See application file for complete search history.

(56) References Cited

U.S. PATENT DOCUMENTS

| 5,430,674 A | 7/1995 | Javanifard |
| 5,644,534 A | 7/1997 | Soejima |
| 5,907,700 A * | 5/1999 | Talreja et al. ................. 713/502 |
| 7,957,204 B1 * | 6/2011 | Wu et al. ................. 365/189.09 |
| 2002/0194422 A1 | 12/2002 | Cohen et al. |
| 2011/0252206 A1 * | 10/2011 | Pyeon ........................... 711/157 |

OTHER PUBLICATIONS

Italian Search Report dated Dec. 6, 2010 from corresponding Italian Application No. MI20101197.
Written Opinion dated Dec. 6, 2010 from corresponding Italian Application No. MI20101197.

* cited by examiner

*Primary Examiner* — Toan Le
(74) *Attorney, Agent, or Firm* — Wolf, Greenfield & Sacks, P.C.

(57) ABSTRACT

A memory device includes a plurality of memory cells and programming circuitry configured to select a group of memory cells, receive a first data word and program memory cells of the selected group based on the data word. The memory device includes a program circuit configured to receive at least one second data word, and, for each second data word, send a program current in parallel to discriminated memory cells based on the corresponding second data word during a corresponding program phase. The memory device further includes an optimization circuit configured to generate the at least one second data word from the first data word. The number of discriminated memory cells of the second data word is maximized compatibly with a maximum predetermined limit of the total program current provided by the program circuit.

17 Claims, 6 Drawing Sheets

CIRCUIT FOR THE OPTIMIZATION OF THE PROGRAMMING OF A FLASH MEMORY

CROSS REFERENCE TO RELATED APPLICATIONS

This application claims the priority benefit of Italian patent application number MI2010A001197, filed on Jun. 30, 2010, entitled CIRCUIT FOR THE OPTIMIZATION OF THE PROGRAMMING OF A FLASH MEMORY, which is hereby incorporated by reference to the maximum extent allowable by law.

BACKGROUND OF THE INVENTION

1. Field of the Invention

The solution according to an embodiment of the present invention regards the electronics field. More specifically, such solution relates to a non volatile memory device.

2. Discussion of the Related Art

A non volatile memory device is a type of memory capable of preserving stored information even in absence of any supply. Among the non-volatile memories presently available on the market, one of the most widespread is the memory of the flash type, simply referred to as flash memory.

A flash memory device is integrated on a chip of semiconductor material and includes one or more blocks, each formed in a respective insulated well (body). Each block comprises a matrix of memory cells with a plurality of rows and columns; the memory cells of each row are connected to a respective word line, while the memory cells of each column are connected to a respective bit line. Typically, each memory cell consists of a MOS transistor, having a floating gate insulated by means of a thin oxide layer.

Making reference to a single level memory, wherein each memory cell is adapted to store a single information bit, an unprogrammed memory cell has a reduced threshold voltage; therefore, when the memory cell is selected, a current flows through the respective bit line-stored bit corresponding to a logic value 1. The memory cell is programmed by injecting electric charge into its floating gate. In this condition, the memory cell has a high threshold voltage; therefore, when the memory cell is selected, no current flows through the respective bit line—stored bit corresponding to a logic value 0. The electric charge injection into the floating gate of a flash memory cell is carried out by a proper programming circuit, adapted to generate program current pulses exploiting voltages of values higher than the supply voltage of the device. Such voltages having values higher than the supply voltage are generated from the latter by a voltage booster circuit, such as a charge pump.

As known to skilled technicians, the current that may be provided by the programming circuit should not exceed a certain limit set by the voltage booster circuit, on penalty of a considerable degradation of the program operation duration, or, even worse, the occurrence of a device's malfunctioning. In order to comply with this limit, and not to incur in the above-mentioned drawbacks, it is preferable to set a maximum number of memory cells to be programmed at the same time—herein referred to as "internal degree of parallelism". Since the values of the threshold voltages of the memory cells of a flash memory are not precisely known a priori—because of the tolerances of the manufacturing processes—the internal degree of parallelism is typically made to correspond to a number of memory cells capable of sinking a current that is sufficiently lower than the limit set by the voltage booster circuit. Particularly, the internal degree of parallelism is typically set in such a way that even programming one or more additional memory cells at the same time, the current sunk is, however, lower than the limit set by the voltage booster circuit, In other words, if correctly set, the internal degree of parallelism is to be intended as the "suggested maximum number of memory cells to be programmed at the same time" rather than the "maximum number of memory cells to be programmed at the same time at any cost".

In order to solve this drawback, the solutions known in the art provide for sending program current pulses in parallel to a number of memory cells that is lower or equal to the above-mentioned internal degree of parallelism. For example, if in a single level flash memory device the specifics provides for the addressing of 64 cells per each program operation, and the internal degree of parallelism is only equal to 16, the program operation is carried out in four subsequent phases, each of which relates to a respective group of 16 memory cells. Particularly, having to program a word formed by 64 bits b[63:0] in 64 respective addressed memory cells, the program operation would be carried out according to the following order:

1) programming of the bits b[15:0] in a first group of 16 cells by means of a first program current pulse;
2) programming of the bits b[31:16] in a second group of 16 cells by means of a second program current pulse;
3) programming of the bits b[47:32] in a third group of 16 cells by means of a third program current pulse, and
4) programming of the bits b[63:48] in a fourth group of 16 cells by means of a fourth program current pulse.

Therefore, the presence of the constraint due to the internal degree of parallelism causes an increase of the total duration of the program operations. For example, presuming that the duration of each program current pulse is equal to 1 usec, in order to write all the 64 bits in the 64 addressed memory cells a total time of 4 usec will be necessary.

However, a program modality of this type is not efficient, as disclosed in the following.

Making reference again to the previous example, according to which a word formed by 64 bits b[63:0] has to be programmed in 64 respective memory cells of a flash memory having an internal degree of parallelism equal to 16, it is now supposed that such word is constituted by a number of 0's lower than 16, but distributed according to a scattered order. For example, such word may have the value 0x0FFFF0FFFFF0EEFF (wherein the prefix 0x means that the value of the word is expressed in hexadecimal), i.e., it includes a number of 0's equal to 14. Applying the previously described solution, the program operation would be carried out according to the following order:

1) programming of the bits b[15:0]=0xEEFF in a first group of 16 cells by means of a first program current pulse;
2) programming of the bits b[31:16]=0xFFF0 in a second group of 16 cells by means of a second program current pulse;
3) programming of the bits b[47:32]=0xFFF0 in a third group of 16 cells by means of a third program current pulse, and
4) programming of the bits b[63:48]=0x0FFF in a fourth group of 16 cells by means of a fourth program current pulse.

Remembering that the memory cells actually subjected to programming, i.e., that actually receive the program current pulse, are those that have to store a 0, it can be noted that the four distinct program phases of the previously considered example may be redundant. Indeed, the overall number of bits of the word to be programmed having a 0 value is equal to 14, and thus is lower than the internal degree of parallelism (16).

As a consequence, instead of carrying out four distinct program phases, the same result could be obtained with a single program phase, with a gain of 75% in terms of duration.

SUMMARY OF THE INVENTION

An aspect of the solution according to an embodiment of the invention proposes a non volatile memory device. Such non volatile memory device comprises a plurality of memory cells and program means configured to select a group of memory cells, receive a first data word and program memory cells of the selected group based on the data word. The program means includes a program circuit configured to receive at least one second data word, and, for each second data word, select a corresponding portion of memory cells of the group and send a program current in parallel to discriminated memory cells of the portion based on the corresponding second data word during a corresponding program phase. The memory device further includes an optimization circuit configured to generate said at least one second data word from the first data word. Each of said at least one second data word is such to cause during each program phase that the number of discriminated memory cells is maximized compatibly with a maximum predetermined limit of the total program current provided by the program circuit.

A further aspect of the solution according to an embodiment of the invention relates to a corresponding method for operating a memory device.

Further advantageous features of the solution itself are indicated in the dependent claims (whose text is herein incorporated by reference).

BRIEF DESCRIPTION OF THE DRAWINGS

These and other features and advantages of the present invention will be made evident by the following detailed description of some exemplary and non-limitative embodiments thereof, to be read in conjunction with the attached drawings, (wherein corresponding elements are indicated with same or similar references, and their explanation is omitted for the sake of brevity, and the name of each entity is generally used for indicating both its type and its attributes—such as its value, its content and representation). Particularly.

DETAILED DESCRIPTION

Figure 1:
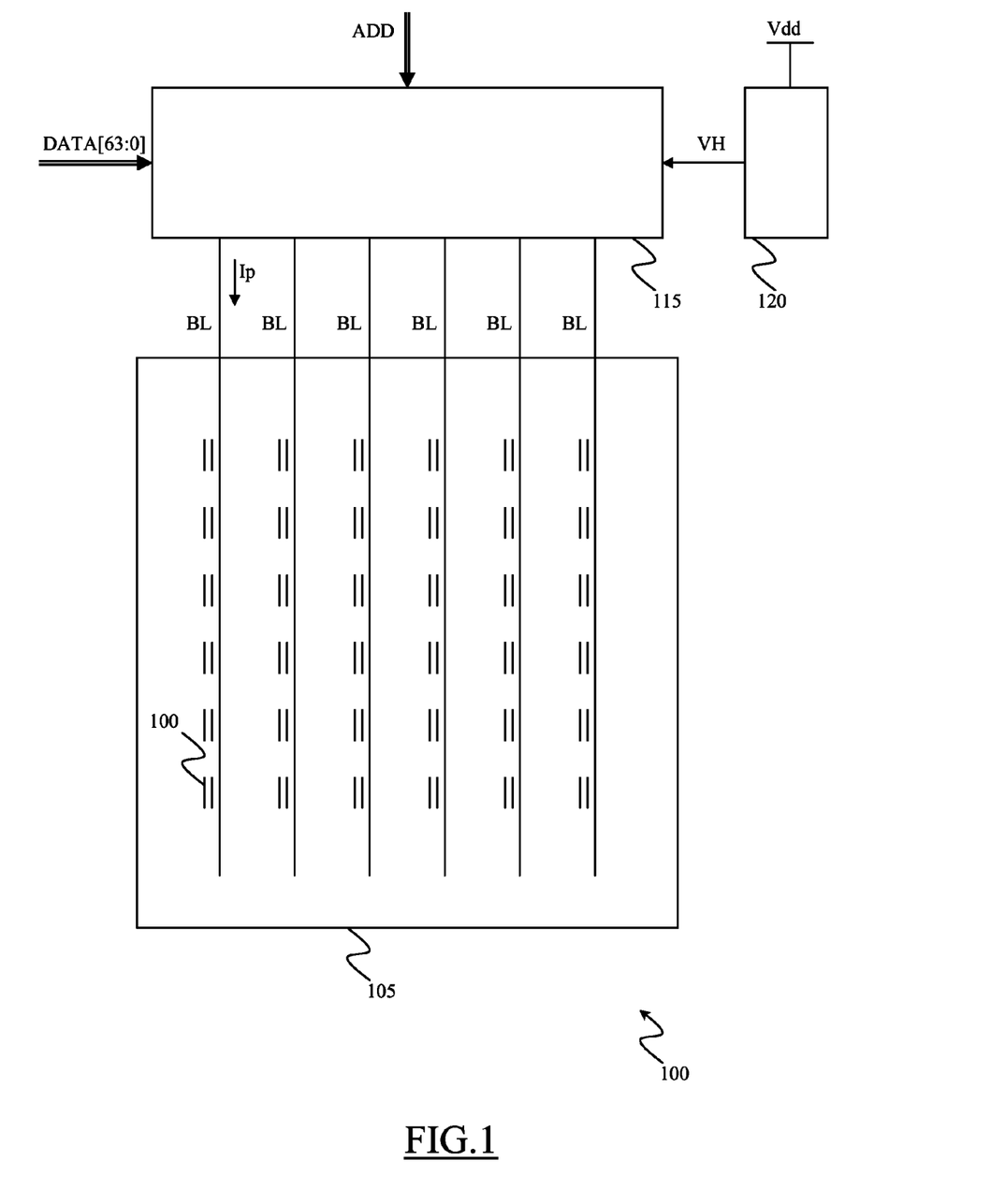
FIG. 1 schematically illustrates an exemplary flash memory device wherein an embodiment may be applied.

With particular reference to FIG. 1, it is illustrated a schematic representation of an exemplary flash memory device 100 wherein an embodiment may be applied. Particularly, the memory device 100 includes a matrix 105 of memory cells 110 arranged in rows and columns; each memory cell 110 comprises a floating gate MOS transistor. Each column of the matrix 105 is associated with a respective bit line BL.

Without entering into details well known to the skilled technicians, the memory cells 110 of the matrix 105 may be arranged according to a NOR architecture or a NAND architecture. Briefly, in a NOR architecture the memory cells 110 of a same column of the matrix 105 are connected in parallel to a same bit line BL, while in a NAND architecture groups of memory cells 110 of a same column of the matrix 105 are connected in series to each other in such a way to form respective strings, which strings are then connected in parallel to each other to a same bit line BL.

The bit lines BL are connected to a program circuit 115, adapted to generate program current pulses to be provided to memory cells 110 selected during the program operations. The program circuit 115 is coupled to a voltage boosting circuit 120 (for example, a charge pump) for receiving a program voltage Vh having a high value—for example, equal to 4.5 Volts—for the generation of the program current pulses. The program voltage Vh is generated by the voltage boosting circuit 120 starting from the supply voltage Vdd of the memory device 100, which has a relatively low value, such as 1.8 Volts. The program circuit 115 is adapted to select a group of bit lines BL based on the address ADD; memory cells 110 connected to the bit lines BL selected by means of the address ADD are then programmed with a data word DATA[63:0], for example formed by 64 bits. Making reference to a single level memory device 100, wherein each memory cell 110 is adapted to store a single information bit, the number of bit lines BL selected by means of the address ADD is equal to the number of bits forming the data word DATA[63:0] (in the considered example, 64). For each selected bit line BL, the program circuit 115 sends or not a respective program current pulse Ip to a memory cell 110 connected to such bit line BL based on the value of a corresponding bit data[i] (i=0, 1, 2, . . . , 63) of the data word DATA[63:0].

For example, if the value of a bit data[i] is equal to 1, the corresponding memory cell 110 does not require any programming, and, thus, any program current pulse Ip; conversely, if the value of a bit data[i] is equal to 0, the corresponding memory cell 110 has to be programmed, and thus receive a program current pulse Ip from the program circuit 115.

As already mentioned above, the current that may be provided to the program circuit 115 cannot exceed a certain limit imposed by the voltage boosting circuit 120. The maximum number nmax of memory cells 110 that can be programmed in the same time (the internal degree of parallelism) is thus a function of such limit. Such maximum number nmax is generally lower than the number of bits data[i] of the data word DATA[63:0] to be programmed; for example, nmax is equal to 16. As a consequence, according to the solutions presently employed, the bits data[i] of the data word DATA[63:0] are programmed in four subsequent phases p(j) (j=1, 2, 3, 4), each of which directed to a group of sixteen memory cells 110.

As previously mentioned in the introduction of the present document, a memory device of this type is not efficient. Indeed, even if the data word DATA[63:0] includes a number of bits data[i] equal to 0 that is lower than max, the programming provides, in any case, for the execution of more than one subsequent phase p(j).

In very general terms, the solution according to an embodiment provides for modifying the data word to be programmed in such a way that each program phase corresponding to the modified data word regards a number of memory cells as close as possible to nmax. Particularly, the data word is dynamically modified in such a way to maximize the number of bits equal to 0 of the data word during each program phase, and at the same time respect as much as possible the constraint nmax.

Figure 2:
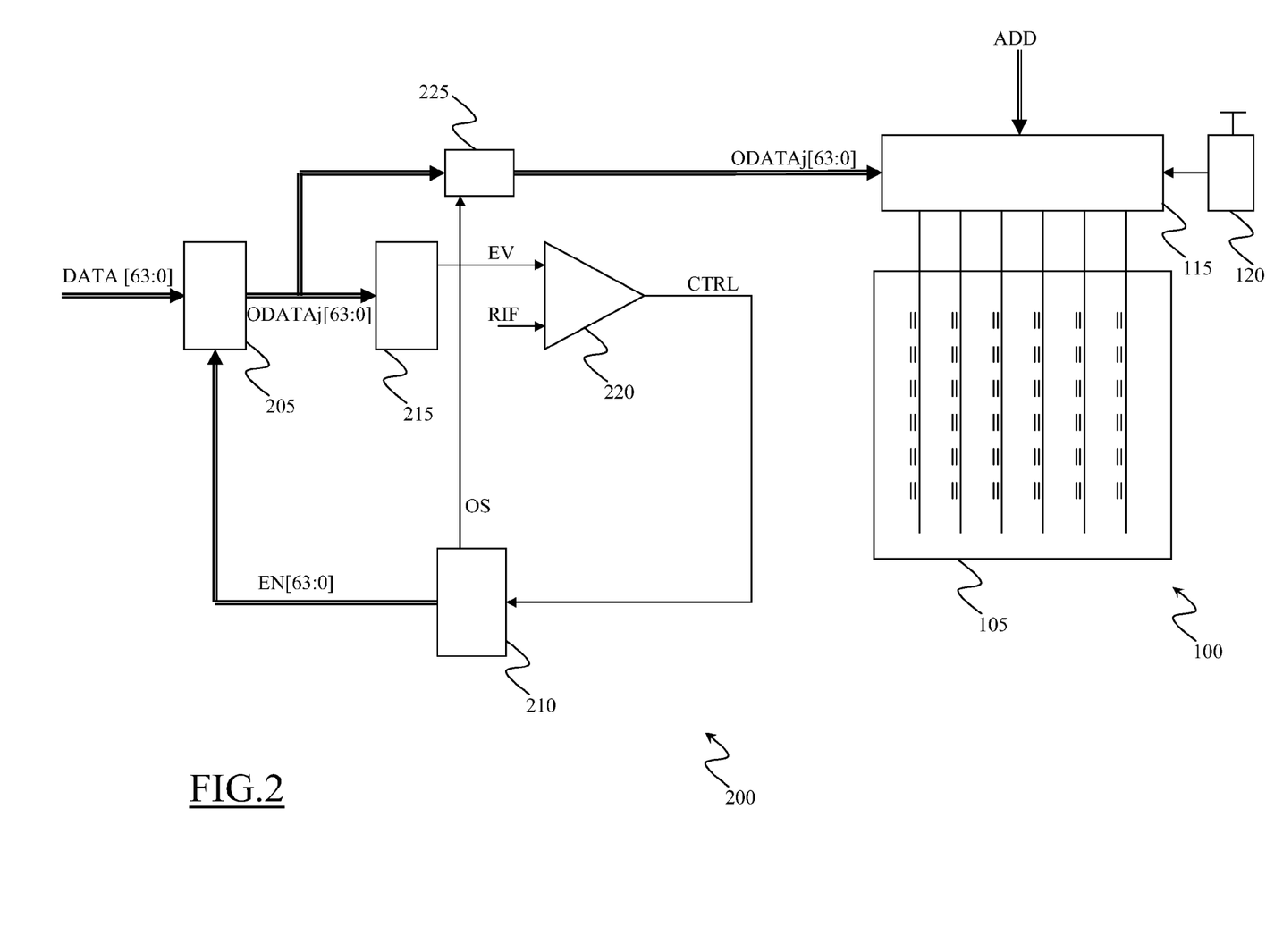
FIG. 2 illustrates an optimization circuit adapted to operate in the circuit of FIG. 1 according to an embodiment.

For this purpose, according to an embodiment illustrated in FIG. 2, instead of directly providing the data word DATA[63:0] to be programmed in a group of selected memory cells 110 to the program circuit 115, such word is provided to an optimization circuit 200. By applying an iterative procedure to the data word DATA[63:0] to be programmed, the optimization circuit 200 generates during each program phase p(j) a corresponding optimized data word ODATAj[63:0]—having the same length of the data word DATA[63:0]—to be actually provided to the program circuit 115. The optimized data words ODATAj[63:0] are generated in such a way that, at the end of the programming, the selected memory cells 110 result to exactly store the received data word DATA[63:0]. As will be now described in the following part of the present description, each optimized data word ODATAj[63:0] exhibits, during each program phase p(j), a number of bits odataj[i] having a value equal to 0 that is equal to nmax—excluding the last program phase p(j), wherein the bits odataj[i] having the value equal to 0 will be generally lower than nmax. In this way, as will be clear in the following description, by concentrating the bits odataj[i] having values equal to 0 in each optimized data word ODATAj[63:0], it is possible to reduce the number of program phases p(j).

The optimization circuit 200 comprises a filter circuit 205, adapted to receive the data word DATA[63:0] and generate the optimized data words ODATAl[63:0] based on an enabling word EN[63:0]—comprising a number of bits en[i] equal to the number of bits data[i] of the data word DATA[63:0]—generated by a control unit 210, for example a state machine. Particularly, each bit odataj[i] of the optimized data word ODATAj[63:0] is set to the corresponding bit data[i] of the data word DATA[63:0] if the corresponding bit en[i] of the enabling word EN[63:0] is equal to 1, or it is set to 1 if the corresponding bit en[i] of the enabling word EN[63:0] is equal to 0. In other words, the filter circuit 205 carries out a filter action of the bits data[i] having the 0 value of the received data word DATA[63:0], wherein such filter action depends on the value actually assumed by the enabling word EN[63:0].

The optimized data word ODATAj[63:0] is converted into an analog evaluation signal EV by a measuring circuit 215 based on the number of bits odataj[i] of the optimized data word ODATAj[63:0] having a value equal to 0. For example, the value of the evaluation signal EV is directly proportional to the number of bits odataj[i] having the 0 value.

The evaluation signal EV is provided to a first input terminal of a comparator circuit 220; a second input terminal of the comparator circuit 220 receives a (analogic) reference signal RIF. The reference signal RIF has a value equal to the value of the evaluation signal EV when the optimized data word ODATAj[63:0] contains a number of 0's equal to the internal degree of parallelism nmax of the memory device 100. Based on the values of the evaluation signals EV and of the reference signal RIF, the comparator circuit 220 generates a (digital) control signal CTRL and provides it to the control unit 210.

The enabling word EN[63:0] is generated by the control unit 210 based on the control signal CTRL.

The optimized data word ODATAj[63:0] is further provided to an input terminal of a transmission gate 225 driven by the control unit 210 through a (digital) opening signal OS. The transmission gate 225 has an output terminal for providing the optimized data word ODATAj[63:0] to the program circuit 115 based on the opening signal OS.

Figure 3:
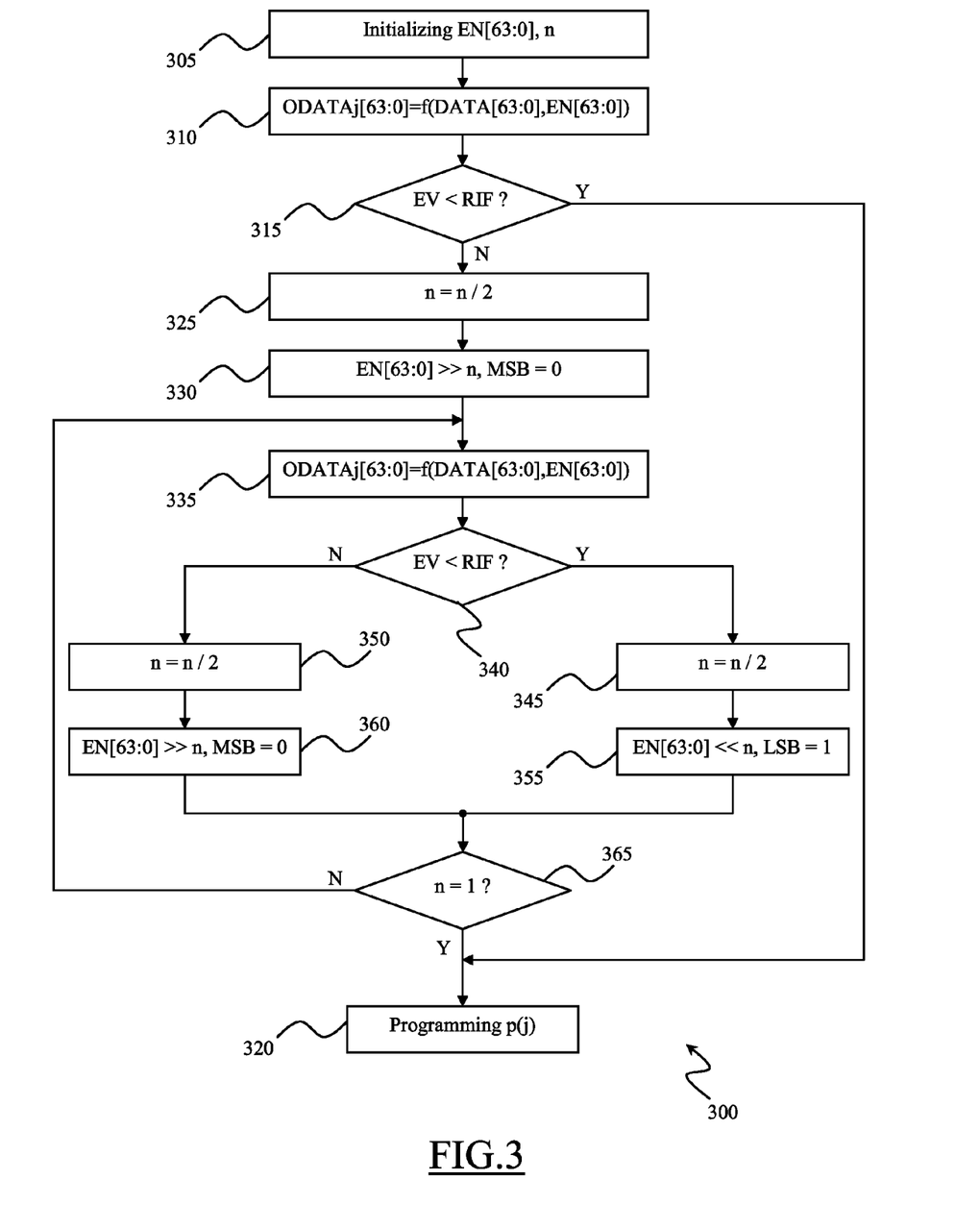
FIG. 3 illustrates a flow chart of the operations carried out by the optimization circuit of FIG. 2 according to an embodiment.

In order to describe the operation of the optimization circuit 200 according to an embodiment, reference will be now made to the flow chart 300 illustrated in FIG. 3, to be jointly considered together with FIG. 2.

As soon as a new data word DATA[63:0] (in the considered example, formed by 64 bits data[i]) to be programmed into a number nprog of selected memory cells 110 (in the considered example, 64) is made available to the memory device 100, the control unit 210 sets a counter n to the value nprog, and all the bits en[i] of the enabling word EN[63:0] to 1 (block 305).

The filtering circuit 205 generates thus an optimized data word ODATAj[63:0] (block 310); the optimized data word ODATAj[63:0] coincides with the data word DATA[63:0], since all the bits en[i] of the enabling word EN[63:0] are equal to 1.

At this point, the value of the optimized data word ODATAj[63:0] is converted by the measuring circuit 215 in the evaluation signal EV, and compared with the reference signal RIF (block 315).

If the evaluation signal EV is lower than the reference signal RIF (exit branch "Y" of block 315), the actual optimized data word ODATAj[63:0] comprises a number of 0's lower than nmax, and the memory device may be programmed without violating the limit imposed by the internal degree of parallelism of the program circuit 115. Consequently, the control unit 210 asserts the opening signal OS, in such a way that the optimized data word ODATAj[63:0] is provided to the program circuit 115 for being programmed in the selected memory cells 110 (block 320).

If instead the evaluation signal EV results to be higher than the reference signal RIF (exit branch "N" of block 315), the actual optimized data word ODATAj[63:0] comprises a number of 0's higher than nmax, and the memory device cannot be programmed without having to violate the limit imposed by the internal degree of parallelism of the program circuit 115.

As a consequence, according to an embodiment, the optimized data word ODATAj[63:0] is modified by the filter circuit 205 by means of a filter operation of the data word DATA[63:0] directed to reduce the number of bits odataj[i] of the optimized data word ODATAj[63:0] having a value equal to 0. Particularly, according to an embodiment, in order to identify an optimized data word ODATAj[63:0] having a number of bits odataj[i] having the 0 value lower than nmax, the control unit 210 manages (by means of the enabling word EN[63:0]) an iterative filtering process based on the dichotomic search.

Specifically, the value of the counter n is halved (block 325), and the enabling word EN[63:0] is subjected by the control unit 210 to a logic right shift operation by a number of positions equal to n (block 330); the Most Significant Bits (MSB) en[i] of the enabling word EN[63:0] left empty by the logic shift operation are all set to 0. In this way, the first n/2 most significant bits en[i] of the enabling word EN[63:0] result equal to 0, while the remaining bits en[i] are equal to 1.

The new enabling word EN[63:0] is therefore used by the filter circuit 205 for generating a new optimized data word ODATAj[63:0] (block 335); in this case, the first n/2 most significant bits odataj[i] of the optimized data word ODATAj[63:0] are all equal to 1—since the corresponding n/2 most significant bits en[i] of the enabling word EN[63:0] are all equal to 0—, while the remaining n/2 Least Significant Bits (LSB) of the optimized data word ODATAj[63:0] are equal to the respective n/2 least significant bits data[i] of the data word DATA[63:0]—since the corresponding n/2 least significant bits en[1] of the enabling word EN[63:0] are equal to 1.

The value of the optimized data word ODATAj[63:0] thus obtained is therefore converted by the measuring circuit 215 into the enabling signal EV, and compared with the reference signal RIF (block 340).

If the evaluation signal EV is lower than the reference signal RIF (exit branch "Y" of the block 340), the actual optimized data word ODATAj[63:0] comprises a number of 0's lower than nmax, while if the evaluation signal EV is higher than the reference signal RIF (exit branch "N" of the block 340), the actual optimized data word ODATAj[63:0] comprises a number of 0's higher than nmax.

In both cases, the actual value of the counter n is halved (blocks 345 and 350, respectively). If the evaluation signal EV was lower than the reference signal RIF, the enabling word EN[63:0] is subjected by the control unit 210 to a logic left shift operation by a number of positions equal to n (block 355); the least significant bits en[i] of the enabling word EN[63:0] left empty by the logic shift operation are all set to 1. If instead the evaluation signal EV was higher than the reference signal RIF, the enabling word EN[63:0] is subjected by the control unit 210 to a logic right shift operation by a number of positions equal to n (block 360); the most significant bits en[i] of the enabling word EN[63:0] left empty by the logic shift operation are all set to 0.

The operations described above are repeated (exit branch "N" of block 365, return to block 335) until the counter n reaches the value 1 (exit branch "Y" of block 365). In this latter case, the optimized data word ODATAj[63:0] results to be filtered in such a way to contain a number of 0's equal to nmax.

As a consequence, the optimized data word ODATAj[63:0] may be programmed without violating the limit set by the internal degree of parallelism of the program circuit 115; then, the control unit 210 asserts the opening signal OS, in such a way that the optimized data word ODATAj[63:0] is provided to the program input 115 for being programmed into the selected memory cells 110 (block 320).

In order to program the remaining bits data[i] of the data word DATA[63:0] equal to 0 that have been filtered by the filter circuit 205 and therefore that were not present in the optimized data word ODATAj[63:0] previously programmed, all the process described until now is repeated from the beginning (from block 305) using a new data word DATA[63:0] whose bits data[i] equal to 0 that were already programmed in the previous phase—in memory cells that have been already received a program current pulse—are set to 1.

Consequently, each complete iteration of the method illustrated in FIG. 3 corresponds to a specific program phase p(j) of a portion of the data word DATA[63:0]. However, unlike the known solutions presently employed, according to which the number of program phases p(j) is determined in a deterministic way, without taking into account the actual number of 0's included in the data word DATA[63:0], the proposed solution optimizes each program phase p(j) in such a way that the programming of a number of 0's is the highest possible (coherently with the limit set by the internal degree of parallelism of the memory). In this way, the number of program phases p(j) may be advantageously lowered down to the bare minimum, reducing thus the total duration of the program operations.

Generally, the number of program phases p(j) is substantially equal to the lowest integer not lower than the value obtained by dividing the total number of 0's included in the data word DATA[63:0] by nmax.

Figure 4:
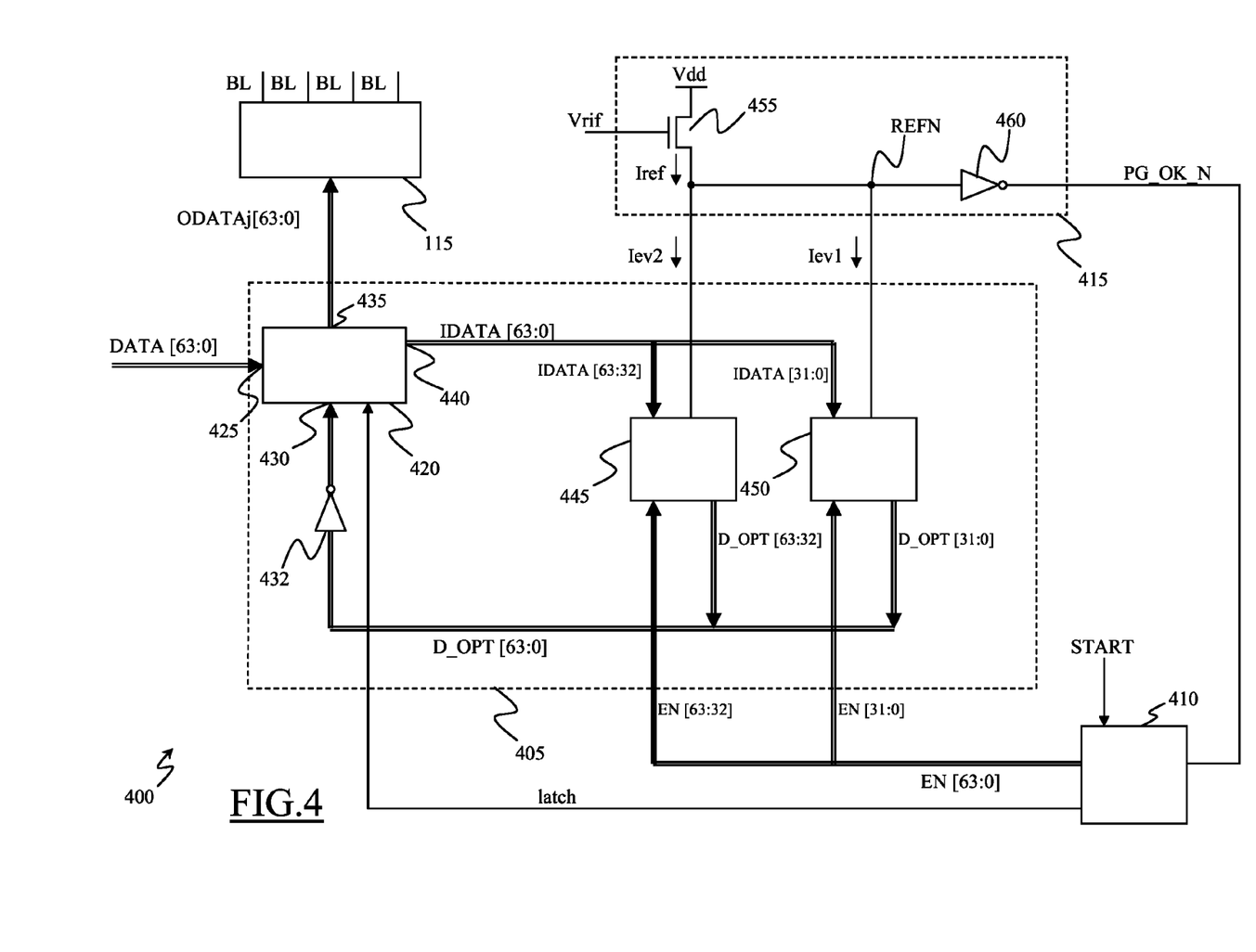
FIG. 4 illustrates an optimization circuit adapted to operate in the circuit of FIG. 1 according to a further embodiment.

FIG. 4 is a circuit scheme of an optimization circuit 400 for the generation of the optimized data words ODATAj[63:0] according to an alternative embodiment.

The optimization circuit 400 comprises a filter and measure circuit 405 for the generation of the optimized data words ODATAj[63:0] starting from the data word DATA[63:0] based on the values assumed by an enabling word EN[63:0] generated by a state machine 410. From the functional point of view, the measure and filter circuit 405 is substantially equivalent to the combination of the filter circuit 205 with the measuring circuit 215 of the optimization circuit 200 illustrated in FIG. 2, while the state machine 410 is equivalent to the control unit 210. The state machine 410 is driven by means of a digital forwarding signal PG_OK_N, generated by a comparator circuit 415 equivalent to the comparator circuit 220 of FIG. 2 based on a comparison between a reference current Iref and two enabling currents Iev1, Iev2 sunk by the measure and filter circuit 405; the activation or not of the state machine 410 is further determined by the value assumed by an activation signal start.

In greater detail, the measure and filter circuit 405 includes a register 420 comprising a single register adapted to store in a volatile way a data word having the same dimension nprog of the data word DATA[63:0] to be programmed (in the example at issue, 64 bits). The register 420 is accessible from the outside (both in reading and in programming) through two input terminals and two output terminals. Through a first input terminal 425 it is possible to store in the register 420 the data word DATA[63:0] to be programmed; a second input terminal 430 allows instead to store in the register 420 the negated version (through a battery of nprog NOT logic gates 432) of an optimization word D_OPT[63:0] having the dimension nprog. A first output terminal 435 is configured to provide the data word stored in the register 420 to the program circuit 115 of the memory device; the data word provided by this terminal corresponds to the optimized data word ODATAj[63:0]. A second output terminal 440 is instead configured to provide the data word stored in the register 420 to proper filter circuits 445, 450 included in the measure and filter circuit 405; in this case, the outputted data word is denoted internal data word IDATA[63:0]. This word is kept unchanged (stored in the register 420) during the whole duration of the generic operative cycle of the state machine 410.

A first filter circuit 445 is adapted to receive the nprog/2 most significant bits idata[i] of the internal data word IDATA [63:0], while a second filter circuit 450 is adapted to receive the nprog/2 least significant bits idata[i] of the internal data word IDATA[63:0]. The first filter circuit 445 is further configured to receive the nprog/2 most significant bits en[i] of the enabling word EN[63:0], while the second filter circuit 450 is further configured to receive the nprog/2 least significant bits en[i] of the enabling word EN[63:0]. Based on the internal data word IDATA[63:0] and the enabling word EN[63:0], the first and the second filter circuits 445, 450 generate, respectively, the nprog/2 most significant bits dopt[i] and the nprog/2 least significant bits dopt[i] of the optimization word D_OPT[63:0].

The comparator circuit 415 comprises an n-channel MOS transistor 455 having a drain terminal connected to a terminal for receiving the supply voltage Vdd, a gate terminal for receiving a reference voltage Vrif and a source terminal connected to the filter circuits 445, 450—circuit node REFN. The comparator circuit 415 further comprises a NOT logic gate 460 having an input terminal connected to the node REFN and an output terminal connected to the state machine 410 for providing the forwarding signal PG_OK_N.

Figure 5:
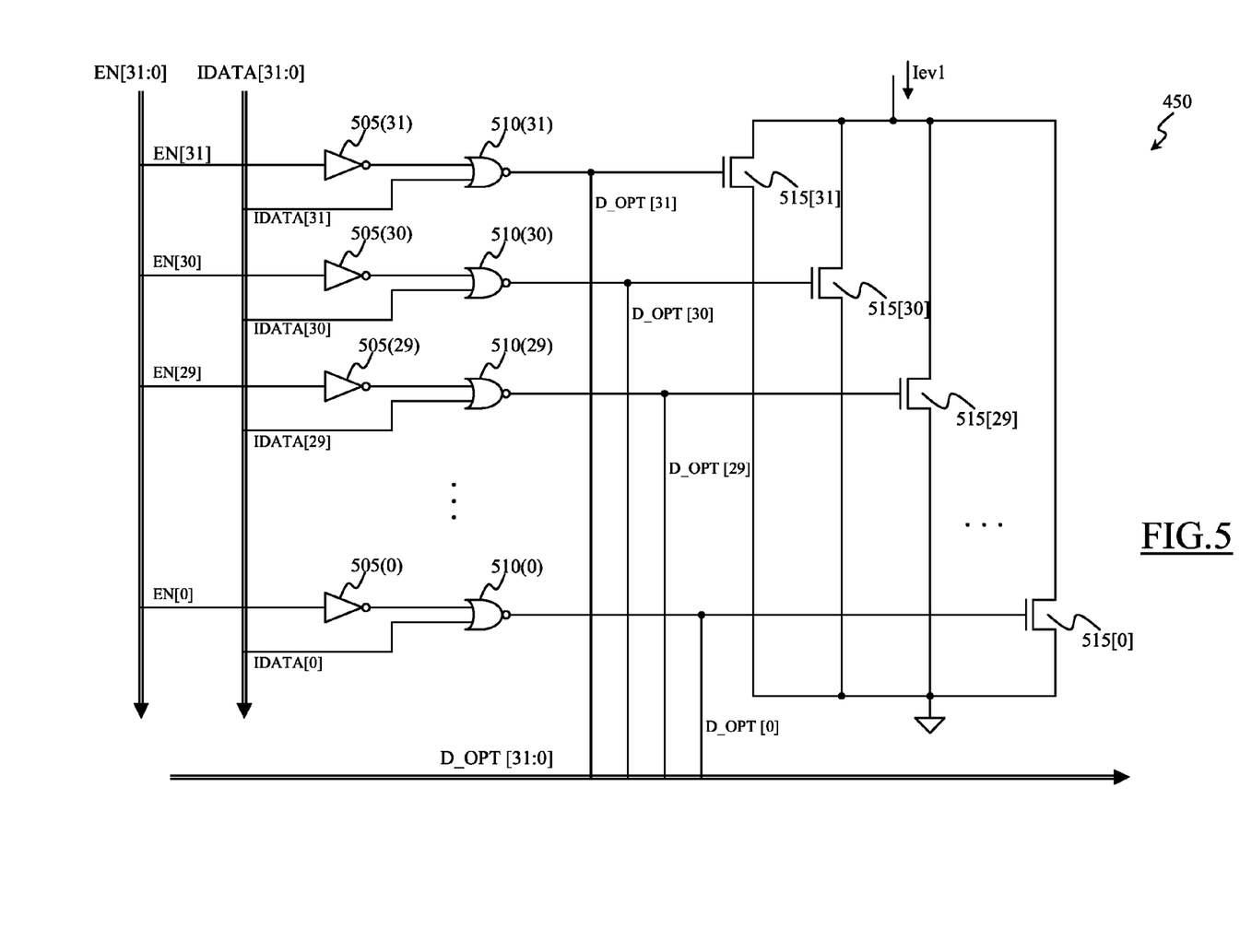
FIG. 5 illustrates the circuit diagram of a filter circuit included in the optimization circuit of FIG. 4 according to an embodiment of the present invention.

The circuit schematic of the filter circuit 450 according to an embodiment is illustrated in FIG. 5 (similar considerations apply for the filter circuit 445).

The filter circuit 450 comprises a plurality of NOT logic gates 505(*i*), a plurality of NOR logic gates 510(*i*) and a plurality of n-channel MOS transistors 515(*i*) (i=31, 30, . . . , 0). Each NOT logic gate 505(*i*) has an input terminal coupled to the state machine 410 for receiving a corresponding bit en[i] of the enabling word EN[63:0] and an output terminal connected to first input terminal of the corresponding NOR logic gate 510(*i*). Each NOR logic gate 510(*i*) further comprises a second input terminal coupled to the register 420 for receiving a corresponding bit idata[i] of the internal data word IDATA[63:0], and an output terminal connected to the gate terminal of the corresponding transistor 515(*i*). The source terminals of all the transistors 515(*i*) are connected to a terminal receiving the ground voltage, while the drain terminals of all the transistors 515(*i*) are connected to the node REFN of the comparator circuit 415. The output of each NOR logic gate 510(*i*) is connected to the register 420 for providing a corresponding bit dopt[i] of the optimization word D_OPT [63:0]. The total current flowing from the node REFN of the comparator circuit 415 to the terminal receiving the ground voltage through the transistors 515(*i*) defines the enabling current Iev1.

The filter circuit 450 (like the filter circuit 445) has a function equivalent to that of the filter circuit 205 of the optimization circuit illustrated in FIG. 2. Particularly, each bit dopt[i] of the optimization word D_OPT[63:0] taken from the output of the corresponding NOR logic gate 510(*i*) is equal to:

$$dopt[i] = \overline{en[i] + idata[i]}.$$

Consequently, each bit dopt[i] of the optimization word D_OPT[63:0] is set to the negated version of the corresponding bit idata[i] of the internal data word IDATA[63:0] if the corresponding bit en[i] of the enabling word EN[63:0] is equal to 1, or is set equal to 0 if the corresponding bit en[i] of the enabling word EN[63:0] is equal to 0. In other words, the resulting optimization word D_OPT[63:0] obtained by means of both the filter circuits 445 and 450 corresponds to the negated version of an internal data word IDATA[63:0] properly filtered in such a way to have the bits idata[i] equal to 1 when the corresponding bit en[i] of the enabling word EN[63:0] is equal to 0.

As a consequence, each transistor 515(*i*) of the filter circuit 450 results to be active only if the corresponding bit en[i] of the enabling word EN[63:0] is equal to 1 and, if the bit idata[i] of the internal data word IDATA[63:0] is equal to 0. The total current sunk by the transistors included in the filter circuits 445 and 450, i.e., the enabling current Iev1 plus the enabling current Iev2, is thus proportional to the number of 0's included in the filtered internal data word IDATA[63:0]—i.e., to the number of 1's included in the optimization word D_OPT[63:0].

Coming back to FIG. 4, the reference voltage Vrif is set in such a way that the reference current Iref generated by the transistor 455 is equal to the sum of the enabling currents Iev1 and Iev2 sunk by the filter circuits 445 and 450 when the number of 0's included in the internal data word IDATA[63:0] filtered by means of the enabling word EN[63:0]—i.e., the number of 1's included in the optimization word D_OPT[63: 0]—is equal to the limit nmax set by the internal parallelism of the program circuit 115. If the number of 1's included in the optimization word D_OPT[63:0] is lower than nmax, the circuit node REFN assumes a higher voltage value, and the forwarding signal PG_OK_N is brought to 0 by the NOT logic gate 460; if the number of 1's included in the optimization word D_OPT[63:0] results instead to be higher than nmax, the circuit node REFN assumes a low voltage value, and the forwarding signal PG_OK_N is brought to 1 by the NOT logic gate 460.

Like the optimization circuit 200, the optimization circuit 400 as well provides for a filtering operation of the internal data word IDATA[63:0] managed by the state machine 410 (through the enabling word EN[63:0]) by means of an iterative filtering process based on the dichotomic search.

Figure 6:
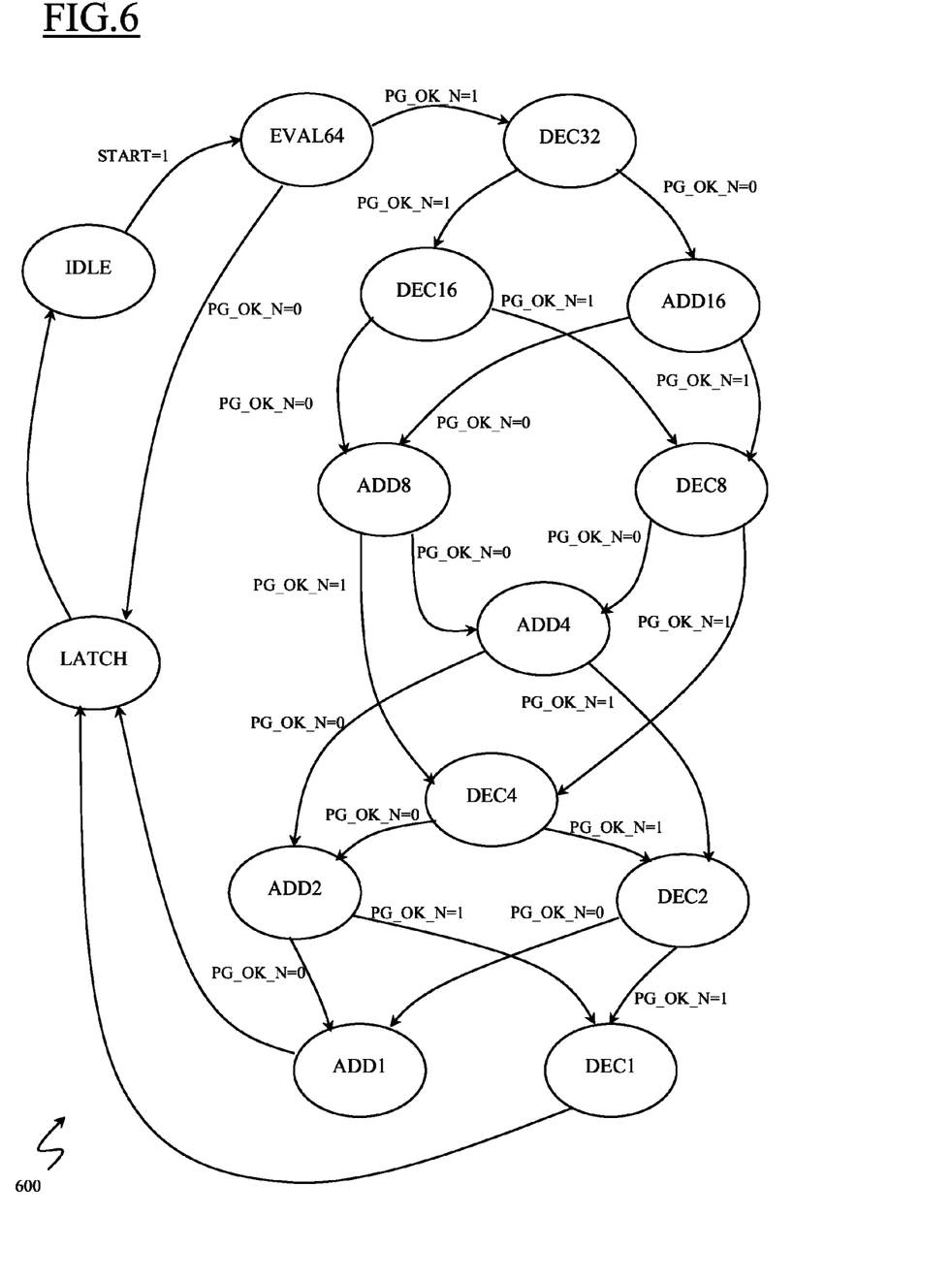
FIG. 6 is a state diagram of a state machine included in the circuit of FIG. 4 according to an embodiment.

FIG. 6 illustrates in detail an exemplary state diagram 600 of the state diagram 410 according to an embodiment when the data word DATA[63:0] to be programmed is formed by a number nprog of bits data[i] equal to 64.

The state diagram 600 comprises a first state IDLE, corresponding to a stand-by state of the state machine 410. When a new data word DATA[63:0] to be programmed is provided to the memory device, and the state machine 410 is still in the state IDLE:

the internal data word IDATA[63:0] coincides with the data word DATA[63:0], and the enabling word EN[63:0] is equal to 0x0000000000000000.

As a consequence, the optimization word D_OPT[63:0] as well has a value equal to 0x0000000000000000.

As soon as the activation signal start is asserted to 1, the state machine 410 exits from the state IDLE and performs the steps of the method corresponding to the previously described flow chart 300 illustrated in FIG. 3.

Particularly, the state machine 410 enters into a state EVAL64, which provides for controlling the number of 0 included in the internal data word IDATA[63:0]—coinciding with the data word DATA[63:0]. Specifically, the enabling word EN[63:0] is set to 0x1111111111111111, and the corresponding currents Iev1 and Iev2 sunk by the filter circuits 445 and 450 are measured by the comparator circuit 415. If the number of 1 included in the corresponding optimization word D_OPT[63:0] is lower than nmax, the forwarding signal PG_OK_N is brought to 0, while if the number of 1 included in the corresponding optimization word D_OPT[63:0] is higher than nmax, the forwarding signal PG_OK_N is brought to 1. In the first case, the internal data word IDATA [63:0] comprises a number of 0 lower than nmax, and thus may be programmed right now; particularly, the state machine passes to the state LATCH, which provides for supplying the word actually stored in the register 420 (denoted optimized data word ODATAj[63:0]) to the program circuit 115 to be programmed. The transfer of the optimized data word ODATAj[63:0] from the register 420 to the program circuit 115 is controlled by the state machine 410 by means of a corresponding signal latch. In the second case, the internal data word IDATA[63:0] comprises a number of 0 higher than nmax, and thus cannot be programmed immediately; as a consequence, such word is subjected to an iterative filtering operation based on the dichotomic search.

Specifically, exiting from the state EVAL64 with PG_OK_N equal to 1, a portion of the state diagram 600 dedicated to the implementation of the filtering based on the dichotomic search is accessed. Making reference to FIG. 6, the states belonging to such portion are of two types:

DECx (x=32, 16, 8, 4, 2, 1), and

ADDx (x=16, 8, 4, 2, 1).

During the generic state DECx, the enabling word EN[63: 0] of the preceding state is subjected to a logic right shift operation by a number of positions equal to x; the most significant bits en[i] of the enabling word EN[63:0] left empty by the logic shift operation are all set to 0.

During the generic state ADDx, the enabling word EN[63: 0] of the preceding state is subjected to a logic left shift operation by a number of positions equal to x; the least significant bits en[i] of the enabling word EN[63:0] left empty by the logic shift operation are all set to 1.

After each shift operation, the corresponding enabling currents Iev1 and Iev2 sunk by the filter circuits 445 and 450 are measured by the comparator circuit 415, and the evolution toward the next state is determined by the corresponding value assumed by the forwarding signal PG_OK_N according to the scheme illustrated in FIG. 6.

At the end of the iterative process, the state machine 410 enters the state LATCH for supplying the optimized data word ODATAj[63:0] to the program circuit 115 for being programmed.

In the same way as for the procedure described in the flow chart 300 of FIG. 3, each complete iteration of the scheme illustrated in FIG. 6 corresponds to a specific program phase p(j) of a portion of the data word DATA[63:0], and thus it is repeated until all the 0 included in such word are terminated.

In order to clarify the above described concepts, reference will be now made to two specific examples of programming exploiting the optimization circuit 400. In both the examples, the data word DATA[63:0] to be programmed is formed by a number nprog of bits data[i] equal to 64, and the internal degree of parallelism nmax is equal to 16.

EXAMPLE 1

The data word DATA[63:0] to be programmed is 0x55FFAAFFAAFF57, i.e. it includes a number of 0 lower than nmax—specifically, 15.
In the state IDLE:
the internal data word IDATA[63:0] to be programmed is equal to 0x55FFAAFFAAFF57;
the enabling word EN[63:0] is equal to 0x0000000000000000, and
the optimization word D_OPT[63:0] is equal to 0x0000000000000000.
As soon as the activation signal start is asserted to 1, the state machine 410 enters the state EVAL64; in this state:
the enabling word EN[63:0] is equal to 0xFFFFFFFFFFFFFFFF, and
the optimization word D_OPT[63:0] is equal to 0xAA0055005500A8.
In this condition, the total number of transistors 515(i) active in the filter circuits 445 and 450 (see FIG. 5) is equal to 15<nmax=16; consequently, the sum of the corresponding enabling currents Iev1 and Iev2 sunk by the filter circuits 445 and 450 is lower than the reference current Iref, and the forwarding signal PG_OK_N is therefore brought to the value 0.
Then, the state machine 410 enters the state LATCH, with the program circuit 115 that receives an optimized data word ODATAj[63:0] equal to not(D_OPT[63:0])= 0x55FFAAFFAAFF57 (program phase p(1)).

Thanks to the proposed solution, the system has automatically realized that the number of 0 in the data word DATA [63:0] to be programmed was lower than the maximum limit nmax, and that the programming may be carried out in a single program phase p(j).

On the contrary, using anyone among the solutions known in the art, the same data word DATA[63:0] would be programmed in four distinct program phases p(j), and particularly:
p(1): programming of FF57;
p(2): programming of FFAA;
p(3): programming of AAFF, e
p(4): programming of 55FF.

EXAMPLE 2

The data word DATA[63:0] to be programmed is 0x55AA55AA55AA55AB, i.e., it includes a number of 0 higher than nmax—specifically, 31.
In the state IDLE:
the internal data word IDATA[63:0] to be programmed is equal to 0x55AA55AA55AA55AB;
the enabling word EN[63:0] is equal to 0x0000000000000000, and
the optimization word D_OPT[63:0] is equal to 0x0000000000000000.
As soon as the activation signal start is asserted to 1, the state machine 410 enters the state EVAL64; in this state:
the enabling word EN[63:0] is equal to 0xFFFFFFFFFFFFFFFF, and
the optimization word D_OPT[63:0] is equal to 0xAA55AA55AA55AA54.
In this condition, the total number of transistors 515(i) active in the filter circuits 445 and 450 is equal to 31>nmax=16; consequently, the sum of the corresponding enabling currents Iev1 and Iev2 sunk by the filter circuits 445 and 450 is higher than the reference current Iref, and the forwarding signal PG_OK_N is therefore brought to the value 1.

Without entering into details for the sake of simplicity, in this example the evolution of the state machine 410 is the following one:
1) state DEC32: —EN[63:0]=0x00000000FFFFFFFF
   D_OPT[63:0]=0x00000000AA55AA54
2) state ADD16: —EN[63:0]=0x0000FFFFFFFFFFFF
   D_OPT[63:0]=0x0000AA55AA55AA54
3) state DEC8: —EN[63:0]=0x000000FFFFFFFFFF
   D_OPT[63:0]=0x00000055AA55AA54
4) state DEC4: —EN[63:0]=0x0000000FFFFFFFFF
   D_OPT[63:0]=0x00000005AA55AA54
5) state DEC2: —EN[63:0]=0x00000003FFFFFFFF
   D_OPT[63:0]=0x00000001AA55AA54
6) state ADD1: —EN[63:0]=0x00000007FFFFFFFF
   D_OPT[63:0]=0x00000005AA55AA54

It is underlined that in the state ADD1 the total number of transistors 515(i) active in the filter circuits 445 and 450 (see FIG. 5) is equal to 17, i.e., equal to nmax+1. This peculiar result is due to the peculiarity of the employed dichotomic search algorithm, which, at each step, provides for comparing the enabling currents Iev1 and Iev2 with the reference current Iref; with the described implementation, the result of such comparison may give only two outcomes, and specifically:
enabling currents Iev1 and Iev2 lower than the reference current Iref, and
enabling currents Iev1 and Iev2 higher than the reference current Iref.
Indeed, the case in which the enabling currents Iev1 and Iev2 results to be equal to the reference current Iref might not be managed by the comparator circuit 415 (and not even by the state machine 410). As a consequence, using the proposed solution, the actual number of memory cells that are programmed in parallel during each programming phase p(j) will be generally equal to nmax−1 or nmax+1. However, as already mentioned above, the internal degree of parallelism of a flash memory device is set in such a way to allow the parallel programming of a number of memory cells higher than nmax by one or two, without having to incur in drawbacks due to the sunk of an excessive amount of current.

Coming back to the considered example, the state machine 410 enters in the state LATCH, with the program circuit 115 that receives an optimized data word ODATAj[63:0]equal to not(D_OPT[63:0])=0xFFFFFFFA55AA55AB (program phase p(1)).

At this point, since there are still 0 to be programmed, the state machine reenters in the state EVAL64, with an internal data word IDATA[63:0] properly modified in such a way to filter the 0 that have been already programmed—in memory cells that have already received a program current pulse—in the preceding program phases p(j). Making reference to the considered example, such internal modified data word IDATA[63:0] is equal to 0x55AA55AFFFFFFFFF.

In the state EVAL64:
the enabling word EN[63:0] is equal to 0xFFFFFFFFFFFFFFFF, and
the optimization word D_OPT[63:0] is equal to 0xAA55AA5000000000.

In this condition, the total number of transistors 515(i) active in the filter circuits 445 and 450 is equal to 14<nmax=16; consequently, the forwarding signal PG_OK_N is therefore brought to the value 0, and the state machine 410 enters the state LATCH, with the program circuit 115 that receives an optimized data word ODATAj[63:0] equal to not(D_OPT[63:0])=0x55AA55AFFFFFFFFF (program phase p(2)).

On the contrary, using anyone among the solutions known in the art, the same data word DATA[63:0] would be programmed in four distinct program phases p(j), and particularly:
p(1): programming of 55AB;
p(2): programming of 55AA;
p(3): programming of 55AA, e
p(4): programming of 55AA.

Although the above described embodiments provide for the use of specific hardware for implementing a filtering based on a dichotomic search, such algorithm may be implemented via software if the program operations are managed by a microcontroller.

Naturally, in order to satisfy local and specific requirements, a person skilled in the art may apply to the solution described above many logical and/or physical modifications and alterations. More specifically, although the present invention has been described with a certain degree of particularity with reference to preferred embodiment(s) thereof, it should be understood that various omissions, substitutions and changes in the form and details as well as other embodiments are possible. Particularly, the proposed solution may even be practiced without the specific details set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A non volatile memory device comprising:
a plurality of memory cells;
programming circuitry configured to select a group of memory cells, receive a first data word and program memory cells of the selected group based on the data word, said programming circuitry including a program circuit configured to receive at least one second data word, and, for each second data word, select a corresponding portion of memory cells of the group and send a program current in parallel to discriminated memory cells of the portion based on the corresponding second data word during a corresponding program phase, and an optimization circuit configured to generate said at least one second data word from the first data word, each of said at least one second data word causing during each program phase, the number of discriminated memory cells to be maximized compatibly with a maximum predetermined limit of the total program current provided by the program circuit, wherein the optimization circuit comprises a measure and filter circuit configured to determine a number of bits of the second data word to be programmed and to output the second data word to the program circuit, and a comparator circuit configured to compare the number of bits of the second data word to be programmed with the maximum predetermined limit and to provide a control signal to enable the measure and filter circuit to output the second data word to the program circuit when the number of bits to be programmed does not exceed the maximum predetermined limit.

2. The memory device of claim 1, wherein:
said group of memory cells comprises a first number of memory cells, and said first and at least second data words are formed each by a number of bits corresponding to the first number, each bit of the first data word and of the at least one second data word corresponding to a respective cell of the group and being equal to a first logic value or to a second logic value, said program means being configured to program the memory cells of the selected group whose corresponding bit is equal to the first logic value;
said discriminated memory cells correspond to memory cells of the corresponding portion whose corresponding bit of the second data word is equal to the first logic value, and
each second data word generated by the optimization circuit comprises a number of bits to the first logic value lower than the maximum limit.

3. The memory device of claim 2, wherein said at least one second data word comprises a number of second data words corresponding to the lowest integer not lower than the value obtained by dividing the total number of bits at the first value by the maximum limit.

4. The memory device of claim 3, wherein the total number of bits at the first logic value of the first data word is lower than the maximum limit, said at least one second data word comprising a single second data word equal to the first data word.

5. The memory device of claim 3, wherein the total number of bits at the first logic value of the first data word is higher than the maximum limit, said at least one second data word comprising a sequence of data words, all the second data words of the sequence except for a last one comprising a number of bits at the first logic value corresponding to the maximum limit.

6. The memory device of claim 1, wherein the memory cells are memory cells of the flash type.

7. The memory device of claim 1, wherein the comparator circuit comprises a current source that generates a reference current which corresponds to the maximum predetermined limit, wherein the measure and filter circuit is configured to draw an enabling current from the current source for each bit of the second data word to be programmed and wherein the control signal enables the measure and filter circuit to output the second data word when a sum of the enabling currents exceeds the reference current.

8. A method for operating a non volatile memory device comprising a plurality of memory cells, said method including:
- selecting a group of memory cells;
- receiving a first data word;
- programming memory cells of the selected group based on the data word, said programming including:
- receiving at least one second data word, and, for each second data word:
- selecting a corresponding portion of memory cells of the group,
- supplying a program current in parallel to discriminated memory cells of the portion based on the corresponding second data word during a corresponding program phase, and
- generating said at least one second data word from the first data word, each of said at least one second data word causing, during each program phase, the number of discriminated memory cells to be maximized compatibly with a maximum predetermined limit, wherein generating said at least one second data word from the first data word comprises determining a number of bits of the second data word to be programmed, comparing the number of bits of the second data word to be programmed with the maximum predetermined limit and outputting the second data word when the number of bits to be programmed does not exceed the maximum predetermined limit.

9. An optimization circuit for programming a memory device, comprising:
- a measure and filter circuit configured to receive a data word to be programmed and to generate an optimized data word;
- a comparator circuit configured to compare a number of bits of the optimized data word to be programmed with a reference number of bits and to provide a control signal; and
- a control unit responsive to the control signal and configured to enable the filter and measure circuit to output the optimized data word to the memory device when the number of bits of the optimized data word to be programmed does not exceed the reference number of bits.

10. An optimization circuit as defined in claim 9, wherein the reference number of bits corresponds to a maximum number of bits of the memory device that can be programmed simultaneously.

11. An optimization circuit as defined in claim 9, wherein the filter and measure circuit, the comparator circuit and the control unit are configured to output optimized data words to the memory device until programming of the data word into the memory device is complete.

12. An optimization circuit as defined in claim 11, wherein a size of each optimized data word except a last optimized data word is equal to the reference number of bits.

13. An optimization circuit as defined in claim 9, wherein the comparator circuit comprises a current source that generates a reference current based on the reference number of bits, wherein the measure and filter circuit is configured to draw an enabling current from the current source for each bit of the optimized data word to be programmed and wherein the control signal is in a first state when a sum of the enabling currents exceeds the reference current and is in a second state otherwise.

14. A method of programming a memory device, comprising:
(a) receiving a data word to be programmed;
(b) determining a number of bits of the data word to be programmed;
(c) if the determined number of bits is less than a reference number of bits, programming the memory device with the data word;
(d) if the determined number of bits is greater than the reference number of bits, generating an optimized data word;
(e) comparing a number of bits of the optimized data word to be programmed with a reference number of bits;
(f) programming the memory device with the optimized data word when the number of bits of the optimized data word to be programmed does not exceed the reference number of bits; and
(g) performing steps (b)-(f) with different optimized data words of the data word until programming of the data word is completed.

15. A method as defined in claim 14, wherein generating an optimized data word includes adjusting a size of the optimized data word until the number of bits of the optimized data word to be programmed does not exceed the reference number of bits.

16. A method as defined in claim 14, wherein the reference number of bits corresponds to a maximum number of bits of the memory device that can be programmed simultaneously.

17. A method as defined in claim 14, wherein a size of each optimized data word except a last optimized data word is equal to the reference number of bits.

* * * * *

UNITED STATES PATENT AND TRADEMARK OFFICE
CERTIFICATE OF CORRECTION

PATENT NO. : 8,681,560 B2
APPLICATION NO. : 13/170591
DATED : March 25, 2014
INVENTOR(S) : Febbrarino et al.

Page 1 of 1

It is certified that error appears in the above-identified patent and that said Letters Patent is hereby corrected as shown below:

\*\*In the Specification:

Column 4, line 59, the word "max" in the sentence should read as follows:
--*nmax*--.\*\*

Signed and Sealed this
Third Day of June, 2014

Michelle K. Lee
*Deputy Director of the United States Patent and Trademark Office*